(12) United States Patent
Moon et al.

(10) Patent No.: US 9,184,155 B2
(45) Date of Patent: Nov. 10, 2015

(54) SEMICONDUCTOR PACKAGE

(71) Applicant: SK hynix Inc., Icheon-si Gyeonggi-do (KR)

(72) Inventors: Ki Il Moon, Yongin-si (KR); Jong Hyun Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/061,871

(22) Filed: Oct. 24, 2013

(65) Prior Publication Data
US 2014/0353847 A1    Dec. 4, 2014

(30) Foreign Application Priority Data
Jun. 3, 2013   (KR) .................. 10-2013-0063253

(51) Int. Cl.
*H01L 23/48*    (2006.01)
*H01L 25/04*    (2014.01)
*H01L 25/065*    (2006.01)

(52) U.S. Cl.
CPC .............. *H01L 25/04* (2013.01); *H01L 25/043* (2013.01); *H01L 25/0657* (2013.01); *H01L 2224/48091* (2013.01); *H01L 2924/19107* (2013.01)

(58) Field of Classification Search
CPC ..... H01L 25/16; H01L 25/0657; H01L 24/73; H01L 24/24; H01L 24/16; H01L 24/14
USPC ........................................................ 257/777
See application file for complete search history.

(56) References Cited

U.S. PATENT DOCUMENTS

| | | | | |
|---|---|---|---|---|
| 2003/0205802 A1* | 11/2003 | Segaram et al. | ............... | 257/690 |
| 2005/0205975 A1* | 9/2005 | Kang et al. | ..................... | 257/678 |
| 2006/0220262 A1* | 10/2006 | Meyer et al. | ................... | 257/779 |
| 2008/0272504 A1* | 11/2008 | Do et al. | ........................ | 257/797 |
| 2009/0317944 A1* | 12/2009 | Kim | ................ | 438/107 |
| 2010/0203677 A1* | 8/2010 | Kwang et al. | ................. | 438/109 |
| 2010/0252937 A1* | 10/2010 | Uchiyama | ..................... | 257/777 |
| 2012/0074451 A1* | 3/2012 | Lin | ................................ | 257/99 |
| 2013/0069245 A1* | 3/2013 | Uchiyama | ..................... | 257/774 |

FOREIGN PATENT DOCUMENTS

KR    100913171 B1    8/2009

* cited by examiner

*Primary Examiner* — A. Sefer
(74) *Attorney, Agent, or Firm* — William Park & Associates Ltd.

(57) ABSTRACT

A semiconductor package includes: a plurality of lead members disposed with a space therebetween over a surface of a substrate, a first semiconductor chip disposed in a face-up manner over the first surface of the substrate between at least two of the plurality of lead members; a second semiconductor chip disposed in a face-up manner over the first semiconductor chip and the at least two lead members, and a connection member for connecting the substrate, the at least two lead members, the first semiconductor chip and the second semiconductor chip with one another.

12 Claims, 10 Drawing Sheets

SEMICONDUCTOR PACKAGE

CROSS-REFERENCES TO RELATED APPLICATIONS

The present application claims priority to Korean patent application number 10-2013-0063253 filed on Jun. 3, 2013, in the Korean Intellectual Property Office, which is incorporated herein by reference in its entirety.

BACKGROUND

1. Technical Field

The present disclosure relates to a semiconductor package, and more particularly, to a semiconductor package manufactured by stacking two or more semiconductor chips.

2. Related Art

In the semiconductor industry, packaging technology is continuously being improved to satisfy demands for miniaturization and mounting reliability of integrated circuits. For example, the demand for miniaturization has expedited the development of techniques for a package having a size approaching that of a chip size, and the demand for mounting reliability has highlighted the importance of packaging techniques for improving the efficiency of mounting work and mechanical and electrical reliability after mounting.

As miniaturization and high performance are demanded in electric and electronic products, new techniques for providing a semiconductor module having a high capacity should be developed. One method for providing a semiconductor module have a high capacity includes the high integration of a memory chip. A high integration of a memory chip can be accomplished by integrating an increased number of cells in the limited space of the semiconductor chip.

However, high integration of a memory chip requires high precision techniques, such as a fine line width, which may require a lengthily development period. Under these situations, a stacking technique has been suggested as another method for providing a semiconductor module having high capacity.

The stacking techniques can generally be divided into methods of embedding two stacked chips in one package and methods of stacking two separate packages which are independently packaged. However, the method of stacking two separate packages is limited in how much the method can decrease the height of the stacked semiconductor package. Thus, the method of stacking to separate package will have difficulties meeting the trend toward miniaturization of electric and electronic products. Therefore, a stack package or a multi-chip package realized by embedding at least two semiconductor chips in one package has been actively studied.

This chip stack package is advantageous in miniaturization and weight reduction in terms of a size, a weight and a mounting area, as compared with a single package in which a single semiconductor chip is embedded therein.

SUMMARY

Various embodiments are generally directed to a semiconductor package capable of realizing miniaturization and slimness of a semiconductor package.

Various embodiments are also directed to a semiconductor package capable of minimizing warpage.

In an embodiment of the present invention, a semiconductor package includes: a plurality of lead members disposed with a space therebetween over a surface of a substrate, a first semiconductor chip disposed in a face-up manner over the surface of the substrate between the lead members, a second semiconductor chip disposed in a face-up manner over the first semiconductor chip and the at least two lead members, and a connection member for connecting the substrate, the at least two lead members, the first semiconductor chip and the second semiconductor chip with one another.

In an embodiment of the present invention, a semiconductor package includes: a plurality of lead members disposed with a space therebetween over a surface of a substrate, a first semiconductor chip disposed in a face-up manner over the first surface of the substrate between at least two of the plurality of lead members, a second semiconductor chip disposed in a face-down manner over the first semiconductor chip and the at least two lead members, and a connection member for connecting the substrate, the at least two lead members, the first semiconductor chip and the second semiconductor chip with one another.

DETAILED DESCRIPTION

Hereafter, various embodiments of the present invention will be described in detail with reference to the accompanying drawings.

Figure 1:
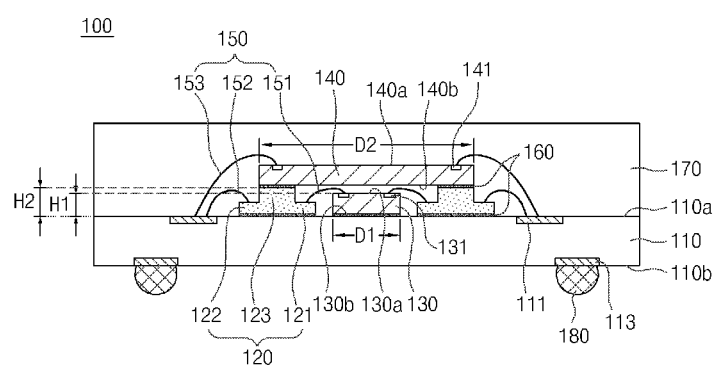
FIG. 1 is a cross-sectional view illustrating a semiconductor package in accordance with an embodiment of the present invention.

Referring to FIG. 1, a semiconductor package 100 in accordance with an embodiment of the present invention includes a substrate 110, a plurality of lead members 120, a first semiconductor chip 130, a second semiconductor chip 140, a connection member 150 and a molding member 170.

The substrate 110 has a first surface 110a and a second surface 110b opposing to the first surface 110a. The substrate 110 may include a printed circuit board. The first surface 110a of the substrate 110 may be formed with at least one bond finger 111. The second surface 110b of the substrate 110 may be formed with at least one ball land 113. The substrate 110 may be provided with circuit wiring (not shown) for electrically connecting the bond finger 111 with the ball land 113, and the circuit wiring may include via patterns. An external terminal 180 such as a solder ball may be formed on the ball land 113.

Figure 4A:
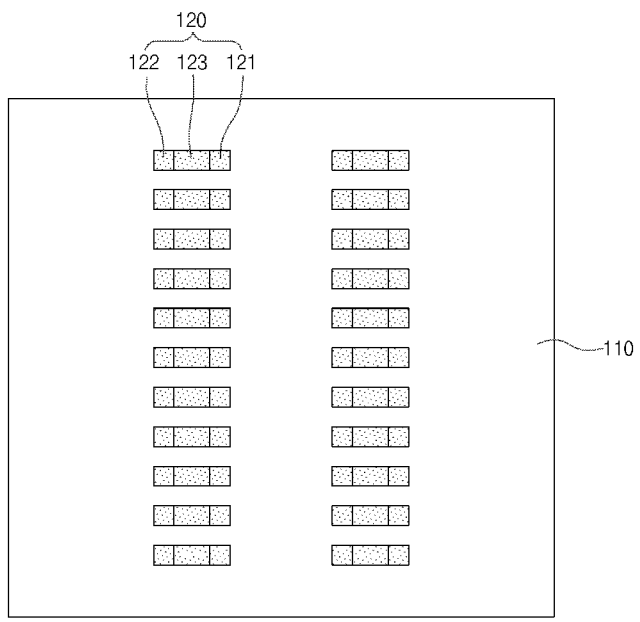

The plurality of the lead members 120 may be attached to the first surface 110a of the substrate 110 using an adhesive member 160. FIG. 4a shows a plan view of the plurality of lead members disposed on a substrate 110. As shown in the plan view of FIG. 4A, the lead members 120 may be arranged such that two lead members 120 are disposed at a predetermined space in an X-axis direction of the plan view and a number of lead members 120 are disposed at spaces in a Y-axis direction of the plan view. The lead member 120 may be formed of a conductive metal having a thermal expansion/ contraction coefficient, a glass transition temperature (Tg) or the like, similar to that of the substrate 110. The lead member 120 includes first and second base portions 121 and 122 with a predetermined height and a stepped portion 123 protruding upward between the first and second base portions 121 and 122. For example, the lead member 120 may have a generally inverted T-shaped cross-section. The height of the lead member 120, particularly the height H2 of the stepped portion 123 is higher than the height H1 of the first semiconductor chip 130.

Returning now to FIG. 1, the first semiconductor chip 130 has a first surface 130a and a second surface 130b opposing to the first surface 130a. The first surface 130a of the first semiconductor chip 130 may be formed with a plurality of first bonding pads 131. For example, the plurality of first bonding pads 131 may be disposed at two edges of the first surface 130a of the first semiconductor chip 130. The first semiconductor chip 130 may be disposed in a face-up manner between the lead members 120, where the lead members 120 may be arranged in the X-axis as shown in FIG. 1 with a space between lead members 120. The first semiconductor chip 130 may be disposed such that as shown in FIG. 1, the first surface 130a faces upward and the second surface 130b is in contact with the first surface 110a of the substrate 110.

The second semiconductor chip 140 has a first surface 140a and a second surface 140b opposing to the first surface 140a. The first surface 140a of the second semiconductor chip 140 may be formed with a plurality of second bonding pads 141. For example, the plurality of second bonding pads 141 may be disposed at two edges of the first surface 140a of the second semiconductor chip 140. The second semiconductor chip 140 may be disposed in a face-up manner over the plurality of the lead members 120 and the first semiconductor chip 130. That is to say, as shown in FIG. 1, the second semiconductor chip 140 may be disposed such that the first surface 140a thereof faces upward and the second surface 140b thereof is attached to the stepped portion 123 of the lead member 120. At this time, the second semiconductor chip 140 may be attached onto the stepped portion 123 of the lead member 120 by medium of an adhesive member 160. The length D2 of a side the second semiconductor chip 140 is longer than the length D1 of a side the first semiconductor chip 130.

The connection member 150 may include a first connection member 151 for connecting the first bonding pad 131 of the first semiconductor chip 130 with the first base part 121 of the lead member 120 adjacent the first bonding pad 131. The connection member 150 may also include a second connection member 152 for connecting the second base portion 122 of the lead member 120 with the bond finger 111 of the substrate 110. The connection member 150 may further include a third connection member 153 for connecting the second semiconductor chip 140 with the substrate 100 by connecting the second bonding pad 141 of the second semiconductor chip 140 with the bond finger 111 of the substrate 110. In the present embodiment, each connection member 150 may be formed of a conductive wire.

The molding member 170 may be formed over the first surface 110a of the substrate 110 such that the molding member 170 encapsulates the lead members 120, the first and second semiconductor chips 130 and 140, and the connection member 150. The molding member 170 may be formed of an EMC (Epoxy Molding Compound).

Hereafter, process steps of fabricating a semiconductor package in accordance with an embodiment of the present invention will be described.

Figure 2A:
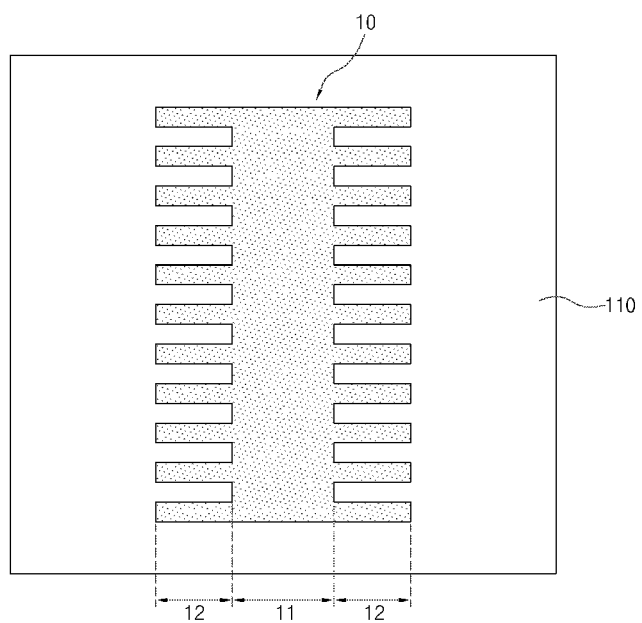
FIGS. 2A to 7 are views illustrating process steps of fabricating a semiconductor package in accordance with an embodiment of the present invention.
Figure 2B:
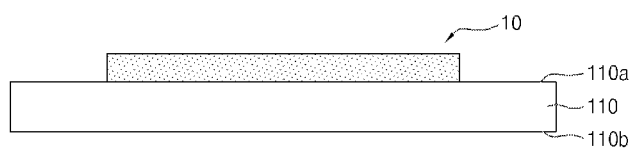

Referring to FIGS. 2A and 2B, a lead frame 10 is disposed over the first surface 110a of the substrate 110. The lead frame 10 is formed of a conductive metal material, and may include, for example, a body 11 and a plurality of leads 12 formed at two sides of the body 11. However, the lead frame 10 may have a different form, if necessary. For example, the lead frame 10 may first be formed into a flat plate without the leads and then formed into a desired form through an etching process.

Figure 3A:
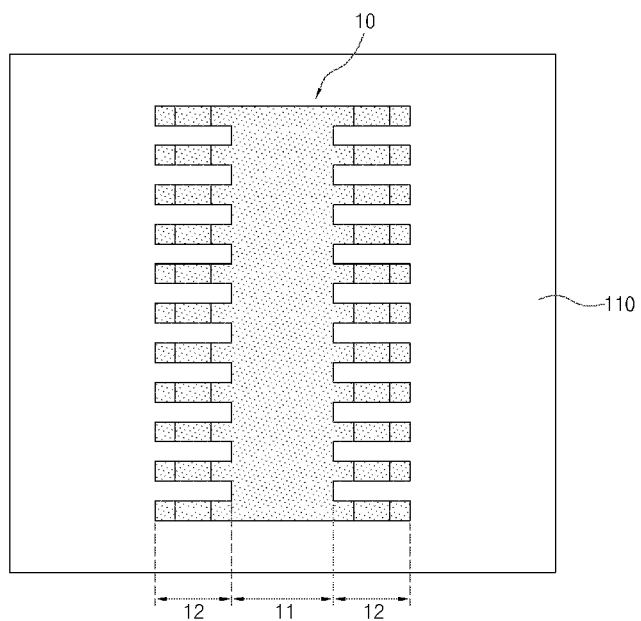
Figure 3B:
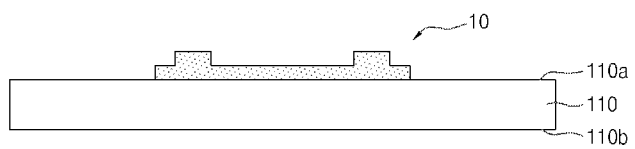

Referring to FIGS. 3A and 3B, a mask (not shown) having a predetermined pattern is disposed over the lead frame 10 and some thickness of the body 11 and leads 12 of a first etching of the lead frame 10 is performed according to the mask pattern.

Figure 4B:
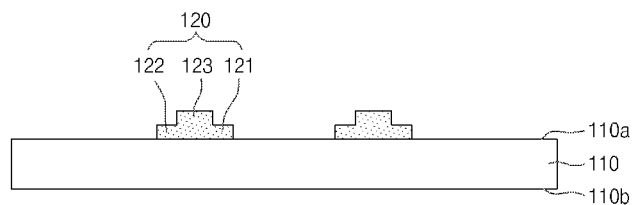
Figure 9:
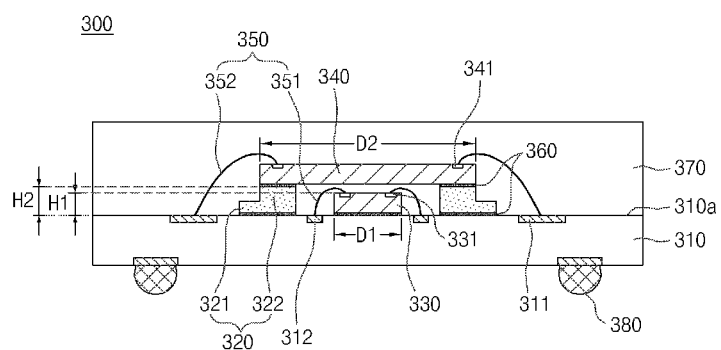
Figure 10:
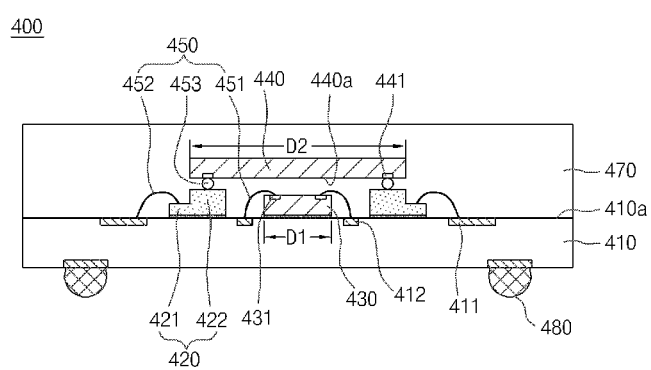

Referring to FIGS. 4A and 4B, the etched lead frame 10 is etched a second time such that the body 11 is completely removed to thereby forming a plurality of lead members 120. Each lead member 120 may include the first and second base portions 121 and 122, and each lead member 120 may comprise the stepped portion 123, and each lead member 120 may have an inverted T-shaped cross-section. For example, the plurality of the lead members 120 is formed such that the lead members 120 are arranged in two rows. In some embodiments, the lead members 120 may be formed to have an L-shaped cross-section as shown in FIGS. 9 and 10 by changing the mask pattern.

Figure 5:
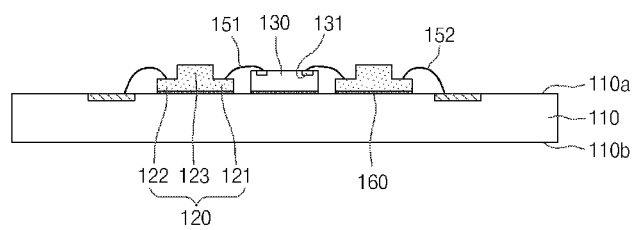

Referring to FIG. 5, the first semiconductor chip 130 is attached in a face-up manner onto the first surface 110a of the substrate 110 between the spaced lead members 120 using the adhesive member 160. The first bonding pad 131 of the first semiconductor chip 130 and the first base portion 121 of the lead member 120 may be connected with each other by the first connection member 151. The second base portion 122 of the lead member 120 and the bond finger 111 of the substrate 110 are connected with each other by the second connection member 152. The first and second connection members 151 and 152 may be formed of a conductive wire.

Figure 6:
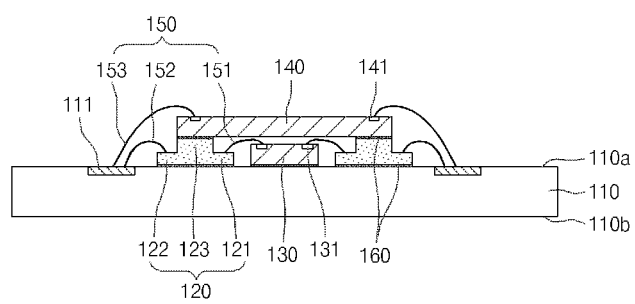

Referring to FIG. 6, the second semiconductor chip 140 is attached in a face-up manner to the first semiconductor chip 130 and the lead members 120. More specifically, the second semiconductor chip 140 is attached to the stepped portions 123 of the lead members 120 using the adhesive member 160. The third connection member 153 may connect the second semiconductor chip 140 with the substrate 110 by connecting the second bonding pad 141 of the second semiconductor chip 140 and the bond finger 111 of the substrate 110. The third connection member 153 may be formed of a conductive wire.

Figure 7:
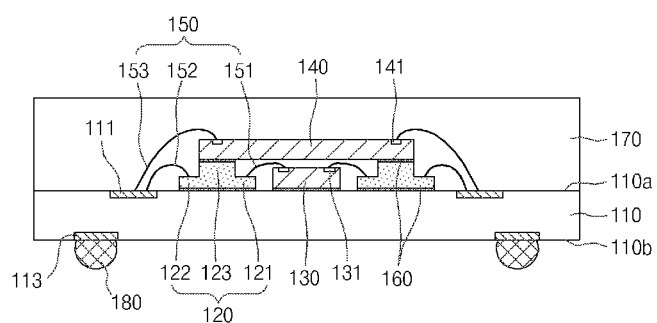

Referring to FIG. 7, the molding member 170 is formed over the first surface 110a of the substrate 110 such that the molding member 170 covers the first and second semiconductor chips 130 and 140, the lead members 120 and the connection members 150. External connection terminals 180 such as solder balls are formed over the ball lands 113, which are formed over the second surface 110b of the substrate 110. Thus, the semiconductor package 100 in accordance with an embodiment of the present invention may be fabricated as seen in FIG. 7.

With the semiconductor package 100 in accordance with an embodiment of the present invention, because the lead members 120 are attached onto the first surface 110a of the substrate 110, warpage of the substrate 110 can be inhibited or minimized even though the substrate 110 may be thin. Particularly, the present invention is very useful when a lower semiconductor chip has a side with a smaller length than that of a side of an upper semiconductor chip in a package formed by stacking a plurality of semiconductor chips.

Hereafter, semiconductor packages in accordance with further embodiments of the present invention will be described. Repeated description for the same component parts will be omitted herein.

Figure 8:
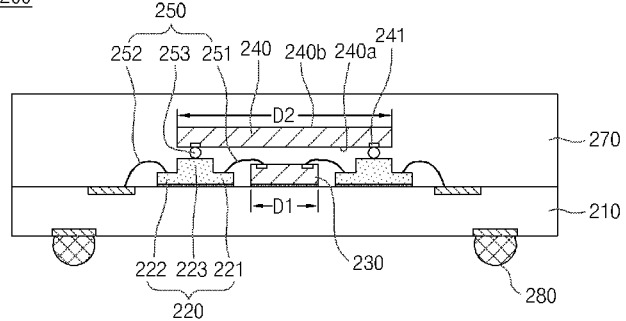
FIGS. 8 to 14 are cross-sectional views illustrating semiconductor packages in accordance with various embodiments of the present invention.

Referring to FIG. 8, a semiconductor package 200 in accordance with the present embodiment is substantially similar to the semiconductor package in accordance with the previous embodiment as shown in FIG. 1, except that a second semiconductor chip 240 is disposed in a face-down manner.

Specifically, the semiconductor package 200 in accordance with the present embodiment includes a substrate 210, lead members 220, a first semiconductor chip 230, a second semiconductor chip 240, a connection member 250, a molding member 270 and external connection terminals 280. The second semiconductor chip 240 includes a plurality of second bonding pads 241 formed over a first surface 240a thereof. The second semiconductor chip 240 may be disposed over the first semiconductor chip 230 and a plurality of the lead members 220 in a face-down manner where the second bonding pads 241 face downward. The second bonding pad 241 of the second semiconductor chip 240 may be electrically connected with a stepped portion 223 of the lead member 220 by the third connection member 253 e.g. a solder bump.

Referring to FIG. 9, a semiconductor package 300 in accordance with an embodiment is substantially similar to the semiconductor package in accordance with the previous embodiment as shown in FIG. 1, except for the shape of lead members 320.

Specifically, the semiconductor package 300 in accordance with an embodiment includes a substrate 310, the lead members 320, a first semiconductor chip 330, a second semiconductor chip 340, a connection member 350, a molding member 370 and external connection terminals 380.

Bond fingers 311 may be formed in portions of the first surface 310a of the substrate 310 which are adjacent to respective lead members 320. Further bond fingers 312 may be formed between the lead members 320 and the first semiconductor chip 330.

The lead members 320 are disposed in plural at predetermined spaces over the first surface 310a of the substrate 310. For example, the lead members 320 are arranged in two rows. The lead member 320 may be attached to the first surface 310a of the substrate 310 using an adhesive member 360. The lead member 320 may comprise a conductive metal having a thermal expansion/contraction coefficient, a glass transition temperature (Tg) or the like, similar to that of the substrate 310. The lead member 320 includes a base portion 321 with a predetermined height and a stepped portion 322 protruding from the base portion 321 such that the stepped portion 322 is higher than the base portion 321. The stepped portion 322 may be formed at a side of the base portion 321. For example, the lead member 320 may have a generally L-shaped, stepped cross-section. The height H2 of the lead member 320 is higher than the height H1 of the first semiconductor chip 330.

The first semiconductor chip 330 is disposed in a face-up manner between the lead members 320. The second semiconductor chip 340 is disposed in a face-up manner over the first semiconductor chip 330 and the lead members 320.

The connection member 350 may include a first connection member 351 for connecting the first semiconductor chip 330 with the substrate 310 by connecting the first bonding pad 331 of the first semiconductor chip 330 with the further bond finger 312 of the substrate 310. The connection member 350 may include a second connection member 352 for connecting the second semiconductor chip 340 with the substrate 310 by connecting the second bonding pad 341 of the second semiconductor chip 340 with the bond finger 311 of the substrate 310. Each connection member 350 may be formed of a conductive wire.

Referring to FIG. 10, a semiconductor package 400 in accordance with an embodiment is substantially similar to the semiconductor package in accordance with the embodiment as shown in FIG. 9, except that a second semiconductor chip 440 is disposed in a face-down manner.

Specifically, the semiconductor package 400 in accordance with the present embodiment includes a substrate 410, lead members 420, a first semiconductor chip 430, the second semiconductor chip 440, a connection member 450, a molding member 470 and external connection terminals 480.

The first semiconductor chip 430 is disposed in a face-up manner over the first surface 410a of the substrate 410. The second semiconductor chip 440 is disposed over the first semiconductor chip 430 and a plurality of the lead members 420 in a face-down manner where the first surface 440a of the second semiconductor chip 440 faces downward. The first surface 440a of the second semiconductor chip 440 may be formed with a plurality of second bonding pads 441.

The connection member 450 includes a first connection member 451 for connecting the first semiconductor chip 430 with the substrate 410 by connecting a first bonding pad 431 of the first semiconductor chip 430 with a further bond finger 412 of the substrate 410. The connection member 450 may also include a second connection member 452 for connecting a base portion 421 of the lead member 420 with a bond finger 411 of the substrate 410. The connection member 450 may further include a third connection member 453 for connecting the second semiconductor chip 440 with the lead member 420 by connecting a second bonding pad 441 of the second semiconductor chip 440 with a stepped portion 422 of the lead member 420. The first and second connection members 451 and 452 may be formed of a conductive wire and the third connection member 453 may be formed of a bump.

Figure 11:
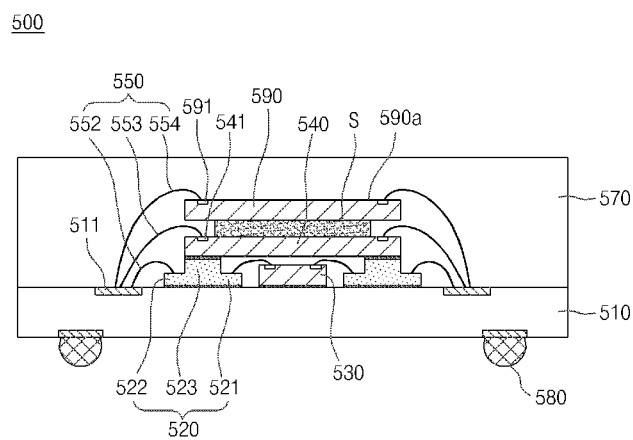

Referring to FIG. 11, a semiconductor package 500 in accordance an embodiment is substantially similar to the semiconductor package in accordance with the embodiment as shown in FIG. 1, except that a third semiconductor chip 590 is disposed in a face-up manner over a second semiconductor chip 540.

Specifically, the semiconductor package 500 in accordance with an embodiment includes a substrate 510, lead members 520, a first semiconductor chip 530, the second semiconductor chip 540, the third semiconductor chip 590, a connection member 550, a molding member 570 and external connection members 580.

One or more third semiconductor chips 590 may be vertically stacked over the second semiconductor chip 540 in a face-up manner. A first surface 590a of the third semiconductor chip 590 is formed with one or more third bonding pad 591. The third bonding pad 591 of the third semiconductor chip 590 may be connected with a bonding finger 511 of the substrate 510 by a fourth connection member 554. The length of a side of the third semiconductor chip 590 may be larger than the length of a side of the first semiconductor chip 530 and identical to the length of a side of the second semiconductor chip 540. The fourth connection member 554 may be formed of a conductive wire.

A spacer S may be interposed between the second semiconductor chip 540 and the third semiconductor chip 590. The spacer S may be formed of an insulation material and serve to ensure the workability and reliability when connecting a second bonding finger 541 of the second semiconductor chip 540 with the bonding finger 511 of the substrate 510 by a third connection member 553 formed of a conductive wire.

Figure 12:
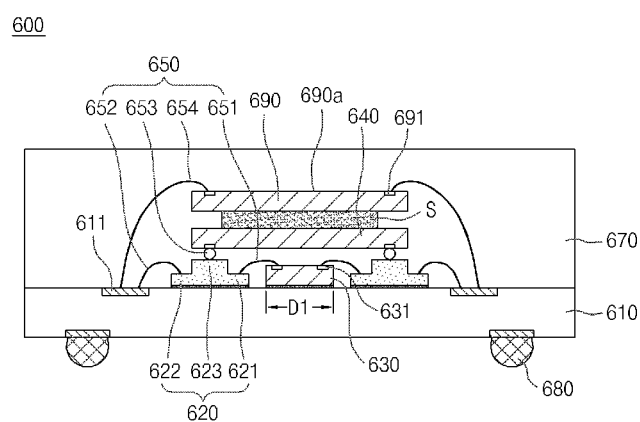

Referring to FIG. 12, a semiconductor package 600 in accordance with an embodiment is substantially similar to the semiconductor package in accordance with the embodiment as shown in FIG. 11, except that a second semiconductor chip 640 is disposed in a face-down manner.

Specifically, the semiconductor package 600 in accordance with the present embodiment includes a substrate 610, lead members 620, a first semiconductor chip 630, the second semiconductor chip 640, a third semiconductor chip 690, a connection member 650, a molding member 670 and external connection terminals 680.

The second semiconductor chip 640 is disposed in a face-down manner over the first semiconductor chip 610 and the lead members 620 by medium of a third connection member 653, e.g. a bump. One or more third semiconductor chips 690 may be vertically stacked over the second semiconductor chip 640 with a spacer S interposed therebetween. A first surface 690a of the third semiconductor chip 690 may be formed with one or more third bonding pad 691. The third bonding pads 691 of the third semiconductor chip 690 may be connected with a bond finger 611 of the substrate 610 by a fourth connection member 654, e.g. a conductive wire. The length of a side the third semiconductor chip 690 may be larger than the length a side of the first semiconductor chip 630 and identical to the length of a side of the second semiconductor chip 640.

Figure 13:
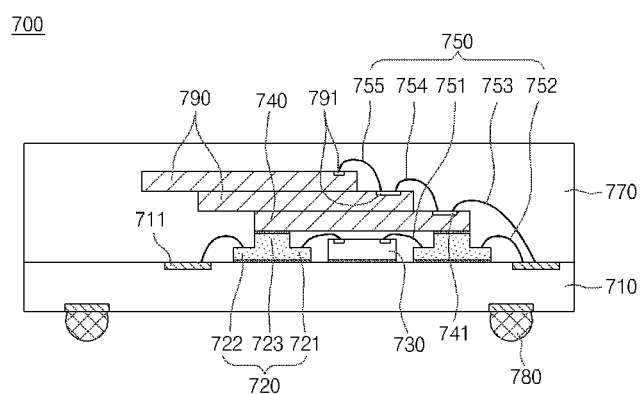

Referring to FIG. 13, a semiconductor package 700 in accordance with an embodiment is similar to the semiconductor package in accordance with the embodiment as shown in FIG. 1, except that a plurality of third semiconductor chips 790 is disposed in a stepped form over a second semiconductor chip 740.

Specifically, the semiconductor package 700 in accordance with the present embodiment includes a substrate 710, lead members 720, a first semiconductor chip 730, the second semiconductor chip 740, the plurality of the third semiconductor chips 790, a connection member 750, a molding member 770, and external connection terminals 780.

The second semiconductor chip 740 is disposed over the first semiconductor chip 730 and the lead members 720 in a face-up manner, and one or more third semiconductor chips 790 is disposed over the second semiconductor chips 740 in a face-up manner. Particularly, one or more third semiconductor chip 790 is disposed over the second semiconductor chip 740 in a stepped form. One surface of the third semiconductor chips 790 may be formed with third bonding pads 791. The third bonding pad 791 of the third semiconductor chip 790 may be connected with the second bonding pads 741 of the second semiconductor chip 740 by a fourth connection member 754, e.g. a conductive wire, and may be connected with another third bonding pad 791 by a fifth connection member 755, e.g. a conductive wire. The length of a side of the third semiconductor chip 790 may be larger than the length of a side of the first semiconductor chip 730 and identical to the length of a side of the second semiconductor chip 740.

Although FIG. 13 shows two third semiconductor chips 790 stacked in a stepped form, in other embodiments more than two third semiconductor chips 790 may be stacked in a stepped form within a given space.

Figure 14:
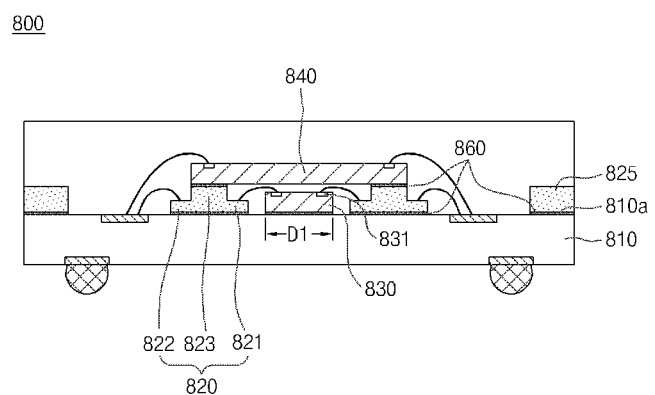

Referring to FIG. 14, a semiconductor package 800 in accordance with an embodiment is substantially similar to the semiconductor package in accordance with an embodiment as shown in FIG. 1, except that further lead members 825 are formed over edges of the first surface 810a of a substrate 810.

The further lead members 825 assist the lead members 820 to inhibit or minimize warpage of the substrate 810 or finished semiconductor package 800. The further lead members 825 may be attached onto the edges of the first surface 810a of the substrate 810 using an adhesive member 860 such that the further lead members 825 do not interfere with the component parts such as the lead members 820 and the connection member 850. The further lead members 825 may be formed of the same material as the lead members 820.

The shape of the further lead members 825 is not particularly limited provided that warpage of the substrate 810 and finished semiconductor package can be inhibited. For example, the further lead members 825 may have a rectangular cross-section or a stepped form.

Although the present embodiment is illustrated example of the case where the further lead members are formed in the semiconductor package in accordance with the embodiment of FIG. 1, the further lead members may also be employed in all of the semiconductor packages in accordance with embodiments as shown in FIGS. 8 to 13.

Figure 15:
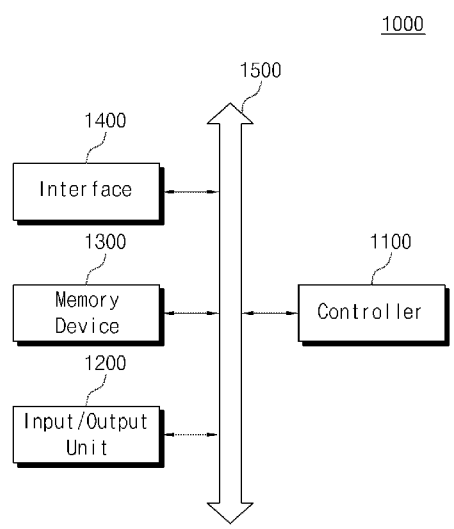
FIG. 15 is a block diagram showing an electronic system to which the semiconductor package in accordance with various embodiments of the present invention is applied.

Referring to FIG. 15, the semiconductor package in accordance with various embodiments of the present invention as described above may be applied to an electronic system 1000. The electronic system may include a controller 1100, an input/output unit 1200 and a memory device 1300. The controller 1100, the input/output unit 1200 and the memory device 1300 may be coupled with one another through a bus 1500 that serves as a path through which data moves.

For example, the controller 110 may include at least any one of at least one microprocessor, at least one digital signal processor, at least one microcontroller, and logic devices capable of performing the same functions as these components. The input/output unit 1200 may include at least one selected among a keypad, a keyboard, a display device, and so forth.

The memory device 1300 may include the semiconductor package according to disclosed embodiments. The memory device 1300 may store data and/or commands to be executed by the controller 1100, and the like. The memory device 1300 may include a volatile memory device and/or a nonvolatile memory device. Otherwise, the memory device 1300 may be constituted by a flash memory. For example, a flash memory to which the technology of the present invention is applied may be mounted to an information processing system such as a mobile terminal or a desktop computer. The flash memory may be constituted by a solid state drive (SSD). In this case, the electronic system 1000 may stably store a large amount of data in a flash memory system.

The electronic system 1000 may further include an interface 1400 configured to transmit and receive data to and from a communication network. The interface 1400 may be a wired or wireless type. For example, the interface 1400 may include an antenna or a wired or wireless transceiver. The interface 1400 is coupled to the bus 1500. Further, while not shown, the electronic system 1000 may be additionally provided with an application chipset, a camera image processor (CIS), an input/output unit, etc.

The electronic system 1000 may be realized as a mobile system, a personal computer, an industrial computer or a logic system performing various functions. For example, the mobile system may be any one of a personal digital assistant (PDA), a portable computer, a web tablet, a mobile phone, a smart phone, a wireless phone, a laptop computer, a memory card, a digital music system and an information transmission/reception system.

In the case where the electronic system 1000 is equipment capable of performing wireless communication, the electronic system 1000 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Figure 16:
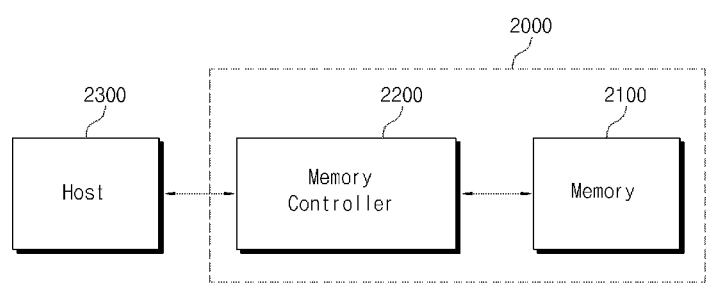
FIG. 16 is a block diagram illustrating a memory card including the semiconductor package in accordance with various embodiments of the present invention.

Referring to FIG. 16, the semiconductor package in accordance with embodiments may be provided in the form of a memory card 2000. For example, the memory card 2000 may include a memory 2100 such as a nonvolatile memory device and a memory controller 2200. The memory 2100 and the memory controller 2200 may store data or read stored data.

The memory 2100 may include at least any one among nonvolatile memory devices to which the packaging technology of the embodiments of the present invention is applied. The memory controller 2200 may control the memory 2100 such that stored data is read out of the memory 2100 or data is stored in the memory 2100 in response to a read/write request from a host 2300.

While the present invention has been described with respect to the specific embodiments, it will be apparent to those skilled in the art that various changes and modifications may be made without departing from the spirit and scope of the invention as defined in the following claims.

What is claimed is:

1. A semiconductor package, comprising:
    a plurality of lead members disposed with a space therebetween over a surface of a substrate;
    a first semiconductor chip disposed in a face-up manner over the surface of the substrate between at least two of the plurality lead members;
    a second semiconductor chip disposed in a face-up manner over the first semiconductor chip and the at least two of the plurality of lead members,
    wherein the second semiconductor chip is disposed directly over the at least two of the plurality of lead members; and
    a connection member for connecting the substrate, the at least two lead members, the first semiconductor chip and the second semiconductor chip with one another.

2. The semiconductor package of claim 1, wherein each of plurality of lead members has an inverted T-shaped cross-section.

3. The semiconductor package of claim 1, wherein the connection member includes:
    a first connection member for connecting the first semiconductor chip with a lead member from among the plurality of lead members;
    a second connection member for connecting the lead member with the substrate; and
    a third connection member for connecting the second semiconductor chip with the substrate.

4. The semiconductor package of claim 3, wherein the first, second and third connection members comprise a conductive wire.

5. The semiconductor package of claim 3, wherein the first, second and third connection members comprise a conductive wire.

6. The semiconductor package of claim 1, wherein each of the plurality of lead members has an L-shaped cross-section.

7. The semiconductor package of claim 6, wherein the connection member includes:
    a first connection member for connecting the first semiconductor chip with the substrate; and
    a second connection member for connecting the second semiconductor chip with the substrate.

8. The semiconductor package of claim 7, wherein the first and second connection members comprise a conductive wire.

9. The semiconductor package of claim 1, further comprising:
    at least one third semiconductor chip stacked over the second semiconductor chip; and
    a further connection member for electrically connecting the stacked third semiconductor chip with the second semiconductor chip or the substrate.

10. The semiconductor package of claim 9, wherein the third semiconductor chip is stacked over the second semiconductor chip in a face-up manner.

11. The semiconductor device of claim 10, wherein the third semiconductor chip is vertically stacked over the second semiconductor chip with a spacer interposed therebetween or stacked in a stepped form without a spacer interposed therebetween.

12. The semiconductor package of claim 1, further comprising:
    further lead members disposed at two edges of the first surface of the substrate.

* * * * *